United States Patent
Kuang

(10) Patent No.: US 10,079,369 B2
(45) Date of Patent: Sep. 18, 2018

(54) OLED DISPLAY PANEL AND MANUFACTURE METHOD THEREOF

(71) Applicant: Shenzhen China Star Optoelectronics Technology Co., Ltd., Shenzhen, Guangdong (CN)

(72) Inventor: Youyuan Kuang, Guangdong (CN)

(73) Assignee: Shenzhen China Star Optoelectronics Technology Co., Ltd, Shenzhen, Guangdong (CN)

( * ) Notice: Subject to any disclaimer, the term of this patent is extended or adjusted under 35 U.S.C. 154(b) by 160 days.

(21) Appl. No.: 15/106,827

(22) PCT Filed: May 4, 2016

(86) PCT No.: PCT/CN2016/080987
§ 371 (c)(1),
(2) Date: Jun. 20, 2016

(87) PCT Pub. No.: WO2017/173693
PCT Pub. Date: Oct. 12, 2017

(65) Prior Publication Data
US 2018/0102507 A1    Apr. 12, 2018

(30) Foreign Application Priority Data
Apr. 5, 2016 (CN) .......................... 2016 1 0205547

(51) Int. Cl.
*H01L 29/08* (2006.01)
*H01L 51/56* (2006.01)
(Continued)

(52) U.S. Cl.
CPC .......... *H01L 51/56* (2013.01); *H01L 27/3232* (2013.01); *H01L 51/5221* (2013.01); *H01L 51/5281* (2013.01)

(58) Field of Classification Search
CPC . H01L 51/56; H01L 51/5072; H01L 51/5012; H01L 51/5056; H01L 33/62
(Continued)

(56) References Cited

U.S. PATENT DOCUMENTS

2011/0291552 A1* 12/2011 Kwon ...................... C09K 9/02
                                                          313/504
2013/0153940 A1    6/2013 Suganuma

FOREIGN PATENT DOCUMENTS

CN    202330875 U    7/2012
CN    202736985 U    2/2013
(Continued)

Primary Examiner — Andy Huynh
(74) Attorney, Agent, or Firm — Andrew C. Cheng

(57) ABSTRACT

The present invention discloses an OLED display panel, comprising a substrate; a semitransparent cathode, formed on the substrate; an emission layer, formed at one side of the semitransparent cathode away from the substrate; a transparent anode, formed at one side of the emission layer away from the semitransparent cathode; and a photochromic layer, being formed at one side of the transparent anode away from the emission layer, and the photochromic layer comprises photochromic material which changes from transparent to opaque under excitation of light, and the light emitted by the emission layer comprises a wavelength employed to excite the photochromic material. The OLED display panel of the present invention has the longer micro cavity total optical distance. The present invention further discloses a manufacture method of an OLED display panel.

10 Claims, 2 Drawing Sheets

(51) Int. Cl.
*H01L 51/52* (2006.01)
*H01L 27/32* (2006.01)

(58) Field of Classification Search
USPC .......................................................... 257/40
See application file for complete search history.

(56) References Cited

FOREIGN PATENT DOCUMENTS

| CN | 103928495 A | 7/2014 |
|---|---|---|
| CN | 104485427 A | 4/2015 |
| CN | 104952908 A | 9/2015 |
| CN | 105304677 A | 2/2016 |

\* cited by examiner

OLED DISPLAY PANEL AND MANUFACTURE METHOD THEREOF

CROSS REFERENCE

This application claims the priority of Chinese Patent Application No. 201610205547.4, entitled "OLED display panel and manufacture method thereof", filed on Apr. 5, 2016, the disclosure of which is incorporated herein by reference in its entirety.

FIELD OF THE INVENTION

The present invention relates to an OLED display panel technical field, and more particularly to an OLED display panel and a manufacture method of the OLED display panel.

BACKGROUND OF THE INVENTION

The OLED (Organic Light-Emitting Diode) display is a new type display technology developed in the middle of the twenty century, and possesses many advantages of ultra thin, all solid state, active luminescence, fast response speed, high contrast, no visual restriction, wide work temperature range, low power consumption, low cost, strong seismic capacity and possibility of flexible display, and will become the main stream of the next generation of flat panel display. Because of the excellent performance and the huge market potential, many factories and scientific research institutions in the worldwide have invested in the production and research of the OLED display panel.

However, due to the vibration tape and the inhomogeneous broadening effect, either for the organic small molecules or high polymer luminescent material, the spectral halfwidth is generally larger than 80 nm. Therefore, the usage ratio is very low in the color display manufactured with synthesis of the red, green, blue, three primary colors. For manufacturing the OLED display panel with narrow-line emission, people change the structure of the OLED display panel, and manufacture the Fabry-Perot (F-P) optical micro cavity of the OLED display panel to acquire the high brightness narrow-line emission. The optical micro cavity does not only realize the narrow-line emission but also significantly enhance the intensity of emission relative to the element of micro cavity structure. The regular F-P optical micro cavity structure requires two reflective mirror surfaces, which generally employ metal-metal structure. Therefore, the micro cavity total optical distance of the F-P optical micro cavity structure is restricted by the thickness and refractivity of the organic film layer in the OLED display panel, and the micro cavity total optical distance is shorter. It is difficult for the insiders to increase the micro cavity total optical distance by adjusting the organic film layer in the OLED display panel.

SUMMARY OF THE INVENTION

An objective of the present invention is to provide an OLED display panel, which has the longer micro cavity total optical distance, and a manufacture method of the OLED display panel.

For realizing the aforesaid objective, the technical solution utilized by the embodiments of the present invention is:

On one hand, provided is an OLED display panel, comprising:

a substrate;

a semitransparent cathode, formed on the substrate;

an emission layer, formed at one side of the semitransparent cathode away from the substrate;

a transparent anode, formed at one side of the emission layer away from the semitransparent cathode; and a photochromic layer, being formed at one side of the transparent anode away from the emission layer, and the photochromic layer comprises photochromic material which changes from transparent to opaque under excitation of light, and the light emitted by the emission layer comprises a wavelength employed to excite the photochromic material.

The transparent anode employs tin indium oxide material.

The semitransparent cathode employs magnesium-silver alloy.

As the emission layer does not emit the light, a transmissivity of the photochromic layer in the visible light range is larger than 90%; as the emission layer emits the light, the transmissivity of the photochromic layer in the visible light range is smaller than 10%.

The photochromic material comprises one or more of silver halide, zinc halide, copper halide, magnesium halide, spiro pyran, phenoxazine, oxazine dye and pyridine.

The OLED display panel further comprises an adjustment layer formed between the photochromic layer and the transparent anode, and the adjustment layer employs transparent material, and is employed to adjust a gap between the photochromic layer and the transparent anode.

The OLED display panel further comprises:

a Hole Injection Layer, formed at the one side of the transparent anode away from the photochromic layer;

a Hole Transporting Layer, formed between the Hole Injection Layer and the emission layer;

an Electron Transport Layer, formed at one side of the emission layer away from the Hole Transporting Layer; and an Electron Injection Layer formed between the Electron Transport Layer and the semitransparent cathode.

On the other hand, further provided is a manufacture method of an OLED display panel, comprising:

sequentially forming a semitransparent cathode, an emission layer and a transparent anode on the substrate;

forming a photochromic layer at one side of the transparent anode away from the emission layer, and the photochromic layer comprises photochromic material which changes from transparent to opaque under excitation of light, and the light emitted by the emission layer comprises a wavelength employed to excite the photochromic material.

The step of sequentially forming a semitransparent cathode, an emission layer and a transparent anode on the substrate comprises:

depositing magnesium-silver alloy at one side of the emission layer away from the transparent anode to form the semitransparent cathode.

depositing emission material at one side of the semitransparent cathode away from the substrate with evaporation to form the emission layer; and depositing tin indium oxide material at one side of the emission layer away from the semitransparent cathode to form the transparent anode.

The step of forming a photochromic layer at one side of the transparent anode away from the emission layer comprises:

depositing the photochromic material at one side of the transparent anode away from the emission layer with evaporation, sputtering or electron beam to form the photochromic layer.

Compared with prior art, the present invention possesses benefits below:

In the OLED display panel according to the embodiment of the present invention, the photochromic layer, the transparent anode, the emission layer, the semitransparent cathode and the substrate are sequentially stacked up. As the emission layer emits the light, the photochromic layer becomes opaque with excitation of the light, and thus to form the resonant cavity with the semitransparent cathode. Because the photochromic layer is at the one side of the transparent anode away from the emission layer, the thickness of the photochromic layer will not influence the voltage drop and the electrical property of the OLED display panel, and meanwhile, the micro cavity total optical distance is increased prevent the overdependency of the micro cavity adjustment to the organic film layer (such as the emission layer) of the OLED display panel for raising the adjustable performance of the OLED display panel and making the OLED display panel possess high light efficiency.

BRIEF DESCRIPTION OF THE DRAWINGS

In order to more clearly illustrate the embodiments of the present invention, the following figures will be described in the embodiments are briefly introduced. It is obvious that the drawings are only some embodiments of the present invention, those of ordinary skill in this field can obtain other figures according to these figures without paying the premise.

DETAILED DESCRIPTION OF PREFERRED EMBODIMENTS

Embodiments of the present invention are described in detail with the technical matters, structural features, achieved objects, and effects with reference to the accompanying drawings as follows. It is clear that the described embodiments are part of embodiments of the present invention, but not all embodiments. Based on the embodiments of the present invention, all other embodiments to those of ordinary skill in the premise of no creative efforts obtained, should be considered within the scope of protection of the present invention.

Figure 1:
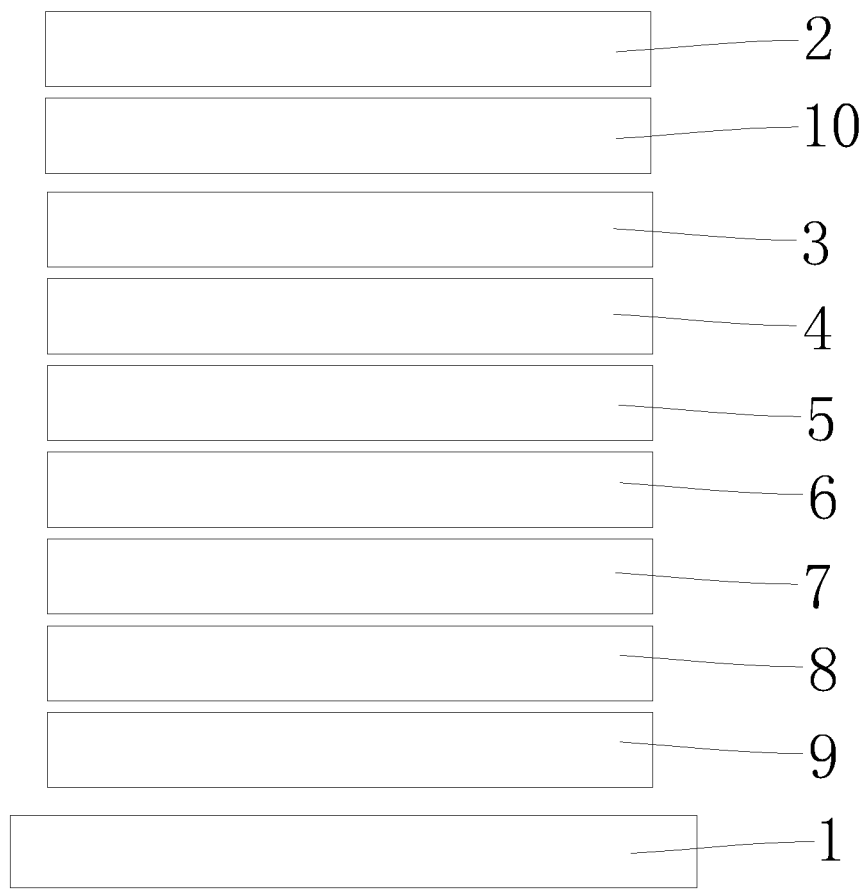
FIG. 1 is a structure diagram of an OLED display panel provided by the embodiment of the present invention.

Please refer to FIG. 1. The embodiment of the present invention provides an OLED (Organic Light-Emitting Diode) display panel, comprising a substrate 1, a semitransparent cathode 9 (Cathode), an emission layer 6 (Emitting Material Layer), a transparent anode 3 (Anode) and a photochromic layer 2. The semitransparent cathode 9 is formed on the substrate 1, and can pass a portion of the light and reflect the other portion of the light. The emission layer 6 is formed at one side of the semitransparent cathode 9 away from the substrate 1, and is employed to emit the light. The transparent anode 3 is formed at one side of the emission layer 6 away from the semitransparent cathode 9, and can pass the light. The photochromic layer 2 is formed at one side of the transparent anode 3 away from the emission layer 6, and the photochromic layer 2 comprises photochromic material which changes from transparent to opaque under excitation of light, and the light emitted by the emission layer 6 comprises a wavelength employed to excite the photochromic material. As the emission layer 6 emits the light, the photochromic layer 2 becomes opaque with excitation of the light, and can reflect the light.

In this embodiment, the photochromic layer 2, the transparent anode 3, the emission layer 6, the semitransparent cathode 9 and the substrate 1 are sequentially stacked up. As the emission layer 6 emits the light, the photochromic layer 2 becomes opaque with excitation of the light, and thus to form the resonant cavity with the semitransparent cathode 9. Because the photochromic layer 2 is at the one side of the transparent anode 3 away from the emission layer 6, the thickness of the photochromic layer 2 will not influence the voltage drop and the electrical property of the OLED display panel, and meanwhile, the micro cavity total optical distance is increased prevent the overdependency of the micro cavity adjustment to the organic film layer (such as the emission layer 6) of the OLED display panel for raising the adjustable performance of the OLED display panel and making the OLED display panel possess high light efficiency.

Furthermore, as being a possible embodiment, the transparent anode 3 employs Indium Tin Oxide (ITO) material, and can raise the Hole Injection ability, and reduce the Hole Injection energy barrier. It should be understood that in other embodiments, the transparent anode 3 also can employ other conductive materials with high work function.

Furthermore, as being a possible embodiment, the semitransparent cathode 9 employs silver-magnesium (Mg/Ag) alloy. The ratio of magnesium and silver is 1:9. It should be understood that in other embodiments, the transparent anode 3 also can employ other semitransparent conductive materials with low work function.

Furthermore, as being a possible embodiment, as the emission layer 6 does not emit the light, a transmissivity of the photochromic layer 2 in the visible light range is larger than 90%; as the emission layer 6 emits the light, the transmissivity of the photochromic layer 2 in the visible light range is smaller than 10%. Preferably, under the excitation of the light, the transmissivity of the photochromic layer 2 in the visible light range is changed from 100% to 0%.

Selectably, the photochromic layer 2 can comprise organic photochromic material and/or inorganic photochromic material. As an illustration, the photochromic material comprises one or more of silver halide, zinc halide, copper halide, magnesium halide, spiro pyran, phenoxazine, oxazine dye and pyridine. The base material of the photochromic layer 2 is selected from but not limited to silicon dioxide or organic resin, and the doping amount of the photochromic material is 0.011 wt %-10 wt %.

Furthermore, as being a possible embodiment, referring to FIG. 1, the OLED display panel further comprises an adjustment layer 10 formed between the photochromic layer 2 and the transparent anode 3, and the adjustment layer 10 employs transparent material, and is employed to adjust a gap between the photochromic layer 2 and the transparent anode 3, and thus to increase the micro cavity total optical distance in advance for raising the adjustable performance of the OLED display panel.

Furthermore, as being a possible embodiment, referring to FIG. 1, the OLED display panel further comprises a Hole Inject Layer 4 (HIL), a Hole Transport Layer 5 (HTL), an Electron Transport Layer 7 (ETL) and an Electron Inject Layer 8 (EIL), which are employed to increases the transportation and the balance of electron and hole, and thus to promote the light efficiency of the OLED display panel. The Hole Injection Layer 4 is formed at the one side of the transparent anode 3 away from the photochromic layer 2. The Hole Transporting Layer 5 is formed between the Hole Injection Layer 4 and the emission layer 6. The Electron Transport Layer 7 is formed at one side of the emission layer 6 away from the Hole Transporting Layer 5. The Electron Injection Layer 8 is formed between the Electron Transport Layer 7 and the semitransparent cathode 9.

Furthermore, as being a possible embodiment, the substrate 1 is a flexible substrate, and then the OLED is a flexible display panel, which can be applied for more usage environment, and the application is wide and various. Certainly, in other embodiment, the substrate 1 also can be a hard substrate, or a combination of a flexible substrate and a hard substrate.

Figure 2:
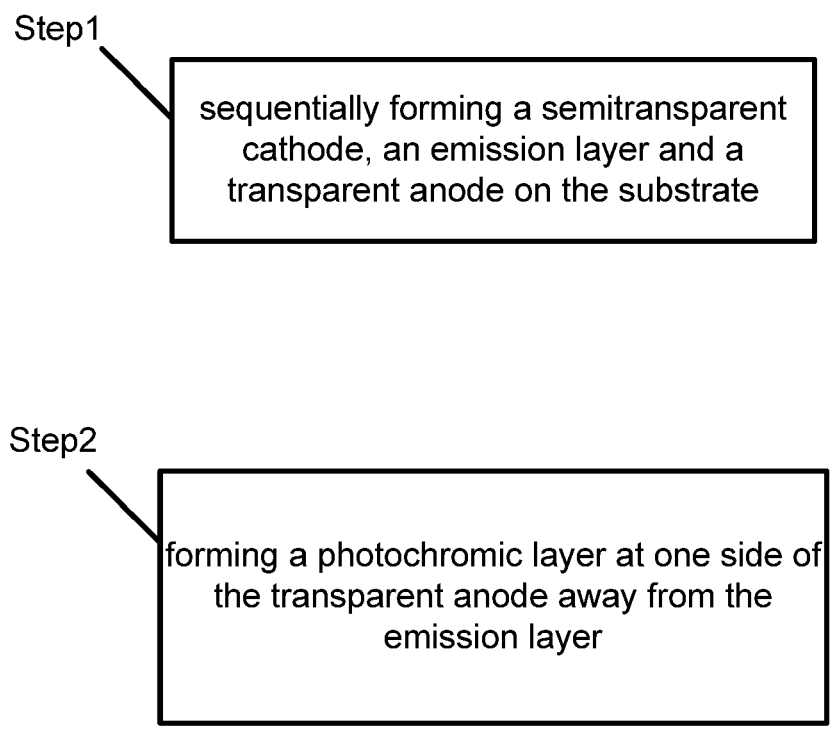
FIG. 2 is a flowchart of a manufacture method of an OLED display panel provided by the embodiment of the present invention.

Please refer to FIG. 1 and FIG. 2. The embodiment of the present invention further provides a manufacture method of an OLED display panel, comprising:

Step 1: sequentially forming a semitransparent cathode 9, an emission layer 6 and a transparent anode 3 on the substrate 1, and the emission layer 6 is employed to emit the light;

Step 2: forming a photochromic layer 2 at one side of the transparent anode 3 away from the emission layer 6, and the photochromic layer 2 comprises photochromic material which changes from transparent to opaque under excitation of light, and the light emitted by the emission layer comprises a wavelength employed to excite the photochromic material.

With the OLED display panel formed by the manufacture method of the embodiment, the photochromic layer 2, the transparent anode 3, the emission layer 6, the semitransparent cathode 9 and the substrate 1 are sequentially stacked up. As the emission layer 6 emits the light, the photochromic layer 2 becomes opaque with excitation of the light, and thus to form the resonant cavity with the semitransparent cathode 9. Because the photochromic layer 2 is at the one side of the transparent anode 3 away from the emission layer 6, the thickness of the photochromic layer 2 will not influence the voltage drop and the electrical property of the OLED display panel, and meanwhile, the micro cavity total optical distance is increased prevent the overdependency of the micro cavity adjustment to the organic film layer (such as the emission layer 6) of the OLED display panel for raising the adjustable performance of the OLED display panel and making the OLED display panel possess high light efficiency.

Furthermore, as being a possible embodiment, the Step 1 comprises:

Step 11: depositing magnesium-silver alloy on the substrate 1 with evaporation to form the semitransparent cathode 9;

Step 12: depositing emission material at one side of the semitransparent cathode 9 away from the substrate 1 with evaporation to form the emission layer 6; and Step 13: depositing tin indium oxide material at one side of the emission layer 6 away from the semitransparent cathode 9 to form the transparent anode 3.

The transparent anode 3 employs Indium Tin Oxide (ITO) material, and can raise the Hole Injection ability, and reduce the Hole Injection energy barrier.

Furthermore, as being a possible embodiment, the Step 2 comprises:

depositing the photochromic material at one side of the transparent anode 3 away from the emission layer 6 with evaporation, sputtering or electron beam to form the photochromic layer 2.

The evaporation means the process that the material to be film (such as photochromic material) is positioned in vacuum for evaporation or sublimation to be separated out on the surface of the substrate 1. The sputtering means that the particles (ion or neutral atom, molecule, such as photochromic material) with certain energy bombards the solid surface to make the atoms or molecules close to the surface of the solid gain the enough energy, and ultimately escape away from the solid surface.

The detail description has been introduced above for the embodiment of the invention. Herein, a specific case is applied in this article for explain the principles and specific embodiments of the present invention have been set forth. The description of the aforesaid embodiments is only used to help understand the method of the present invention and the core idea thereof; meanwhile, for those of ordinary skill in the art, according to the idea of the present invention, there should be changes either in the specific embodiments and applications but in sum, the contents of the specification should not be limitation to the present invention.

What is claimed is:

1. An OLED display panel, comprising:
   a substrate;
   a semitransparent cathode, formed on the substrate;
   an emission layer, formed at one side of the semitransparent cathode away from the substrate;
   a transparent anode, formed at one side of the emission layer away from the semitransparent cathode; and
   a photochromic layer, being formed at one side of the transparent anode away from the emission layer, and the photochromic layer comprises photochromic material which changes from transparent to opaque under excitation of light, and the light emitted by the emission layer comprises a wavelength employed to excite the photochromic material, wherein the photochromic layer forms a resonant micro cavity with the semitransparent cathode for the light emitted by the emission layer to increase a total optical distance of the resonant micro cavity to provide a higher light efficiency of the OLED display panel.

2. The OLED display panel according to claim 1, wherein the transparent anode employs tin indium oxide material.

3. The OLED display panel according to claim 1, wherein the semitransparent cathode employs magnesium-silver alloy.

4. The OLED display panel according to claim 1, wherein as the emission layer does not emit the light, a transmissivity of the photochromic layer in the visible light range is larger than 90%; as the emission layer emits the light, the transmissivity of the photochromic layer in the visible light range is smaller than 10%.

5. The OLED display panel according to claim 4, wherein the photochromic material comprises one or more of silver halide, zinc halide, copper halide, magnesium halide, spiro pyran, phenoxazine, oxazine dye and pyridine.

6. The OLED display panel according to claim 1, wherein the OLED display panel further comprises an adjustment layer formed between the photochromic layer and the transparent anode, and the adjustment layer employs transparent material, and is employed to adjust a gap between the photochromic layer and the transparent anode.

7. The OLED display panel according to claim 1, wherein the OLED display panel further comprises:
   a Hole Injection Layer, formed at the one side of the transparent anode away from the photochromic layer;
   a Hole Transporting Layer, formed between the Hole Injection Layer and the emission layer;
   an Electron Transport Layer, formed at one side of the emission layer away from the Hole Transporting Layer; and
   an Electron Injection Layer formed between the Electron Transport Layer and the semitransparent cathode.

8. A manufacture method of an OLED display panel, comprising steps of:
sequentially forming a semitransparent cathode, an emission layer and a transparent anode on a substrate;
forming a photochromic layer at one side of the transparent anode away from the emission layer, and the photochromic layer comprises photochromic material which changes from transparent to opaque under excitation of light, and the light emitted by the emission layer comprises a wavelength employed to excite the photochromic material, wherein the photochromic layer forms a resonant micro cavity with the semitransparent cathode for the light emitted by the emission layer to increase a total optical distance of the resonant micro cavity to provide a higher light efficiency of the OLED display panel.

9. The manufacture method of the OLED display panel according to claim 8, wherein the step of sequentially forming a semitransparent cathode, an emission layer and a transparent anode on the substrate comprises:

depositing magnesium-silver alloy at one side of the emission layer away from the transparent anode to form the semitransparent cathode;

depositing emission material at one side of the semitransparent cathode away from the substrate with evaporation to form the emission layer; and depositing tin indium oxide material at one side of the emission layer away from the semitransparent cathode to form the transparent anode.

10. The manufacture method of the OLED display panel according to claim 9, wherein the step of forming a photochromic layer at one side of the transparent anode away from the emission layer comprises:

depositing the photochromic material at one side of the transparent anode away from the emission layer with evaporation, sputtering or electron beam to form the photochromic layer.

* * * * *